United States Patent [19]

Kyle

[11] 4,190,486
[45] Feb. 26, 1980

[54] METHOD FOR OBTAINING OPTICALLY CLEAR, HIGH RESISTIVITY II-VI, III-V, AND IV-VI COMPOUNDS BY HEAT TREATMENT

[75] Inventor: Nanse R. Kyle, Santa Monica, Calif.

[73] Assignee: Hughes Aircraft Company, Culver City, Calif.

[21] Appl. No.: 775,667

[22] Filed: Mar. 8, 1977

Related U.S. Application Data

[63] Continuation of Ser. No. 403,577, Oct. 4, 1973, abandoned.

[51] Int. Cl.$^2$ .................................................. B01J 17/36
[52] U.S. Cl. ............................ 156/601; 156/616 A; 156/616 R; 156/DIG. 73; 156/DIG. 72
[58] Field of Search ............... 156/616 A, 616 R, 614, 156/DIG. 90, 601, DIG. 73; 256/62.3

[56] References Cited

U.S. PATENT DOCUMENTS

| | | | |
|---|---|---|---|
| 3,033,791 | 5/1962 | Nobel | 252/62.3 |
| 3,113,056 | 12/1963 | Doorn | 156/DIG. 90 |
| 3,297,403 | 1/1967 | Haacke | 156/614 |
| 3,615,203 | 10/1971 | Kaneko | 156/616 A |
| 3,615,205 | 10/1971 | Blum | 156/616 |

OTHER PUBLICATIONS

Nobel, Philips Res. Repts. 14, pp. 367–399 and 430–492, 1959.
Gentile, Mat. Res. Bull., vol. 8, pp. 523–532, 1973.
Kyle, J. of Electrochem. Soc., vol. 118, #11, Nov. 1971.

Primary Examiner—Hiram H. Bernstein
Attorney, Agent, or Firm—Lewis B. Sternfels; W. H. MacAllister

[57] ABSTRACT

Desired conductivity type and carrier concentration in the Group II–VI, III–V, and IV–VI compounds in which at least one constituent is volatile is obtained by varying the partial pressure of one of the volatile constituents with respect to the compound solid, which is then controllably cooled while simultaneously changing the component pressure to maintain the compound within the high resistivity area of its phase diagram. For example, donor doped cadmium telluride is maintained at a temperature range of about 1000° C. at 0.9 atmospheres in the constituent atmosphere to obtain high resistivity (up to $10^9$ ohm-cm.) and then slow-cooled to a preferred temperature of 700° C. or lower in the high resistivity region and/or between the stoichiometric line and its dope line, and then into the high resistivity region but above its minimum pressure line where the compound begins to sublime congruently, followed by removal of the material from the furnace. The invention has been reported in Materials Research Bulletin, Vol. 8, pp. 523–532, 1973, Pergamon Press, Inc.

26 Claims, 11 Drawing Figures

METHOD FOR OBTAINING OPTICALLY CLEAR, HIGH RESISTIVITY II-VI, III-V, AND IV-VI COMPOUNDS BY HEAT TREATMENT

BACKGROUND OF THE INVENTION

The invention herein described was made in the course of or under a contract or subcontract thereunder, with the Department of the Air Force.

This is a continuation of application Ser. No. 403,577 filed Oct. 4, 1973, now abandoned.

FIELD OF THE INVENTION

The present invention relates to a heat treatment method and apparatus for obtaining desired conductivity type and carrier concentration as well as optical properties in the Group II-VI, Group III-V, and Group IV-VI compounds and, in particular, for controlled slow-cooling of such compounds. Since no two compounds have exactly the same electrical, optical, or physical properties, a specific discussion of the properties of one compound does not necessarily apply directly to any other compound. For example, the melting point, vapor pressure, and equilibrium conditions for cadmium telluride cannot apply to any other compound. However, cadmium telluride is exemplary of the inventive method hereof.

DESCRIPTION OF THE PRIOR ART

The Group II-VI compounds, for example, have found extensive use as semiconductors, photo sensitive devices, radiation detectors, infrared windows, infrared lenses, optical modulators, and infrared light pipes. One compound of interest is cadmium telluride. Much investigation has been conducted into this field, especially with respect to obtaining high resistivity compounds having at least a resistivity of $10^5$ ohm-centimeters. In addition, IR windows, lenses, and light pipes require further perfection in optical properties, in particular low absorption coefficients.

High resistivity ($\rho$) materials have been obtained by the methods described by D. de Nobel in his Phillips Research Reports, Vol. 14, pages 361-492 (1959) and, more specifically in his U.S. Pat. No. 3,033,791, and in the invention described in copending application, Ser. No. 69,025 now abandoned, but divided in which the divisional application has issued as U.S. Pat. No. 3,870,473 dated Mar. 11, 1975 (see also Journal of the Electromechanical Society, Vol. 118, No. 11, November 1971, pp 1790-1797 which references reports of others interested in cadmium telluride). However, it was not possible to obtain by such methods a low absorption coefficient ($\beta$) in the order of less than 0.002 cm$^{-1}$, as a result of insufficiently controlled defects and percipitants.

In a companion patent application, Ser. No. 331,450, now abandoned a continuation of Ser. No. 69,055, now abandoned, which is also described in the Journal of the Electrochemical Society, Vol. 118, No. 11, November 1971, pp 1790-1797, it was also suggested that after the last portion of the melt had been solidified, the tube be removed from the furnace, thereby quenching, rather than slowly cooling, the solidified hot crystal, thus preventing vacancies and foreign atoms from being able to move to energetically more favorable positions. This quenching provides high resistivity of the crystal, but only for small crystals in the order of 100 grams. For such smaller crystals, cooling is sufficiently fast to prevent a change in defect concentration from the region of high resistivity and past the dope and stoichiometric lines into the low resistivity N-Type region of the phase diagram for the material. However, with larger crystals, e.g. 500 grams, the defect concentration will change across the above-mentioned lines into the low resistivity region, at least for interior portions of the crystal. Thus, the crystal will exhibit a resistivity profile from high resistivity to low resistivity. It was not possible to consistently obtain low absorption material. These and other results, such as strain and percipitates, can be attributed to the process of quenching.

BACKGROUND REGARDING MAKING OF THE INVENTION

In recognition of these and other problems, during the making of the present invention, initial experimental results indicated greater reproducibility and improvement in sample optical quality, i.e. lowering of the optical absorption coefficient over previously used techniques and reduction of strain and percipitants, leading to an observation of $\beta$ (the absorption coefficient) = 0.0007 cm$^{-1}$ in a 5 cm diameter, 1 cm thick disk. The procedure has been successful for more than two dozen samples, including ingots exceeding 5 cm diameter by 10 cm long. Average optical absorption coefficient values at 10.6 $\mu$m have lowered to less than 0.002 cm$^{-1}$. Further results using this thermal anneal procedure for several crystals show that no significant differences appear among the various starting materials used.

The thermal anneal which yielded these results essentially follows close to the dope line, for example, of $2 \times 10^{17}$ indium atoms/cm$^3$. However, the annealing can take place anywhere in the area between the stoichiometric line and the dope line later crossing the dope line into the high resistivity region at some temperature-pressure therein, or by completely staying in the high resistivity region.

In practice, the sample is cooled to approximately 700° C. where this equilibrium is realized. At that point, the sample is rapidly cooled to room temperature. Below 700° C. diffusion rates are slow and the rate of cooling is not critical. However, cooling to room temperatures provides essentially the same results. One other factor which is important is the deviation from stoichiometry of the as-grown ingot. When, for example, the ingot is slow-cooled across the stoichiometric line following the isobar p (pressure) = 0.8 atm cadmium a longer soak time is required to restore the desired composition to actually slightly cadmium poor. This factor has shown itself to be important for both quench and slow-cool thermal annealing procedures.

If a crystal is slow cooled to nearly room temperature from the crystal growing furnace, it will have a higher concentration of cadmium than a crystal taken out of the furnace at a higher temperature. Crystals, which were grown and slow cooled, were compared to crystals which were taken out hot at 880° C. These latter crystals were found to have a different composition than the slow cooled crystals. According to theory, the crystal withdrawn at the higher temperature have a lower concentration of cadmium than the slow cooled crystals. Also, if the crystals are removed from the furnace at a high temperature corresponding to a stoichiometric composition or on the tellurium side of the phase diagram, the cadmium concentration will be a minimum.

It is believed that the crystal growing process (slow cool versus quench) was the cause of the inconsistency, the crystals were heat treated at a high temperature in the high resistivity range for a long time to establish composition equilibrium before starting the slow cool process. Consequently, if excess cadmium caused the inconsistency, it can be reduced through thermal equilibrium according to the phase diagram. In addition the object was also to keep the tellurium concentration at a minimum. Consequently, it meant working near the characteristic line corresponding to the doping concentration. The latter was tried first since it is nearer the high resistivity range than the stoichiometric line. Experimental results indicated that the optical properties are a function of the composition.

SUMMARY OF THE INVENTION

The present invention overcomes the above-noted and other problems by a post-thermal annealing procedure which comprises a controlled slow cooling step of the compound crystal with accompanying change in overpressure of one of the compound constituents to cause the crystal to remain in the high resistivity region of the phase diagram for the particular compound.

It is, therefore, an object of the present invention to provide a method of consistently producing low absorption coefficient (optically clear) and high resistivity (low carrier concentration) in Group II–VI, Group III–V, and Group IV–VI compounds of the Table of Periodic Elements.

Another object is to provide a method for minimizing clustering and precipitation in doped Group II–VI, Group III–V, and Group IV–VI compounds.

Another object is to provide a method for obtaining low carrier concentration in such compounds.

Another object is to provide a method for obtaining low defect concentration in such compounds.

Another object is to provide a method for obtaining both low carrier concentration and low defect concentration in such compounds.

Another object is to provide a method for obtaining low strain in such compounds.

Another object is to provide a method for allowing the use of substantially pure, undoped cadmium telluride with accompanying sufficient control of cadmium pressure as a function of temperature.

Other aims and objects as well as a more complete understanding of the present invention will appear from the following explanation of exemplary embodiments and the accompanying drawings thereof.

DESCRIPTION OF THE PREFERRED EMBODIMENTS

The present invention was reported in Materials Research Bulletin, Volume 8, pages 523–532, 1973, Pergamon Press, Inc., and the material contained therein is incorporated herein as if fully stated in haec verba.

In the following a preferred method of growing the desired crystal of a II–VI, III–V or IV–VI Group compound is first described followed by a description of the inventive heat-treating system for the crystal.

Figure 1:
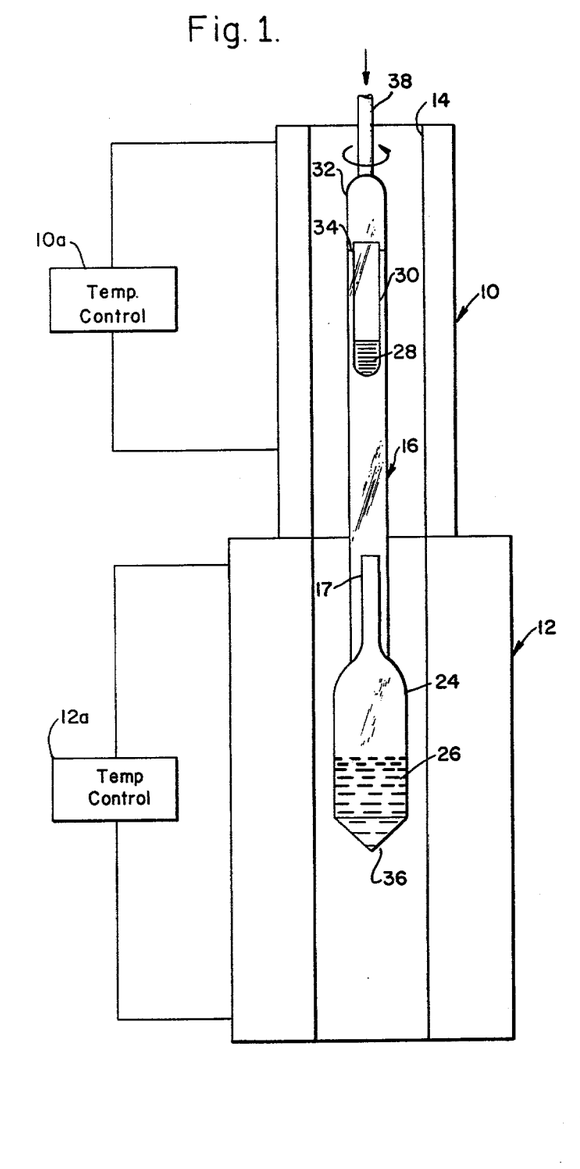
FIG. 1 illustrates a schematic representation of a two-part furnace with a crystal growing tube therein for growth of the crystals of the present invention.
Figure 1A:
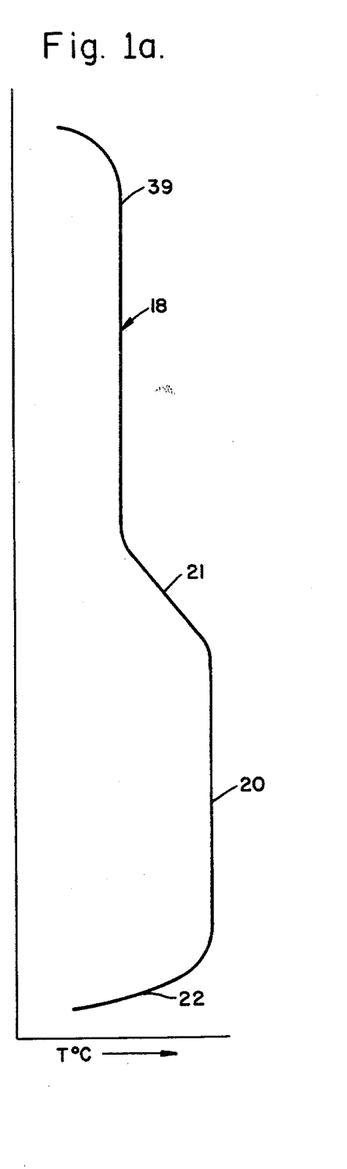
FIG. 1a schematically depicts the temperature curves of the furnaces.

Accordingly, a pair of furnaces 10 and 12 are vertically placed one atop the other or in tandem with a central opening 14 extending therethrough for placement therein and movement of a crystal growing tube 16, in which a compound 26 and one of its constituents 28 are placed. A barrier 17 is positioned in the tube to act as a collector of the volatile component in case refluxing occurs. The temperature of furnace 10 is controlled by means 10a so as to provide a temperature curve 18 for constituent 28 while the temperature of furnace 12 is controlled by means 12a to provide a temperature profile 20 for compound 26. The temperature of furnace 10 is less than that of furnace 12 as shown in FIG. 1a, thereby producing an increasing temperature gradient 21 therebetween. The temperature of furnace 12 is further controlled to provide a decreasing temperature gradient 22 which includes the temperature at which a melt of the compound becomes a solid. Furnace 10 is disposed to be at a temperature to provide a vapor pressure of constituent equal to or greater than the minimum pressure (see also FIG. 4) at which sublimation and/or decomposition of compound 26 occurs to prevent sublimation and decomposition thereof, while furnace 12 is heated to provide a maximum temperature above the melting point of the compound.

Tube 16 is provided with a lower section 24 in which a charge 26 of pure II–VI, III–V, or IV–VI Group compound is placed. One constituent 28 of the compound is placed in a receptacle or reservoir 30 at another section 32 of tube 16 and secured thereto by one or more supports 34. The preferred purity of the compound and constituent is at least 99.9999% in order to prevent the conductivity and type of material from being determined by the concentration and kind of impurities which would be otherwise present. Section 24 of the tube is terminated by a nucleation point 36 of any suitable shape, as is well known in the art. Support of section 24 may be provided or section 32 may have attached to it a rod 38 for rotating and lowering the tube through the furnace. Flat portion 39 of temperature curve 18 is maintained for a sufficiently long length so that, when tube portion 24 moves into and through decreasing temperature gradient 22, constituent 28 will remain in flat temperature portion 39.

In operation, a quantity of II–VI, III–V, or IV–VI Group compound, in compound or elemental form, which need not be stoichiometric, is placed in section 24 of tube 16 while the desired compound constituent is placed within receptacle 30 of the tube. The tube is then sealed and evacuated to approximately $10^{-8}$ Torr, or partially filled or pressurized with an inert gas.

The tube with its contained materials is then placed within the two-part furnace as shown in FIG. 1 and the temperatures of furnaces 10 and 12 are established to provide a melt of compound 26 and vaporization of constituent 28. The temperature of constituent 28 at flat portion 39 is adjusted to provide a desired vapor pressure thereof above the decomposition and/or sublimation pressure of the compound. As a consequence, a thermodynamic equilibrium is soon established between vaporized constituent 28 and melt 26 because, if the melt is deficient in the volatile component for this vapor pressure, then the component is removed from the vapor and added to the melt, and conversely, if the melt is rich in the component, then it leaves the melt as a vapor. Thus, regardless of what the composition of the melt may originally be, the composition can be reproducibly adjusted to whatever composition is desired by controlling the temperature of the vapor. For example, if constituent 28 comprises cadmium and compound melt 26 comprises cadmium telluride, an increase in the cadmium concentration in the melt will produce a correspondingly high electron concentration in the solid. The opposite result is obtained with a tellurium constituent as the tellurium pressure increases.

The pressure of the component in reservoir 30 is changed by changing the temperature of furnace 10. For cadmium telluride, by increasing the cadmium pressure, and consequently effecting a reduction in the tellurium pressure, more cadmium is added to the system. Thus, the composition of cadmium telluride is controlled. Also, the same process would apply to tellurium. Increasing tellurium pressure would reduce the cadmium pressure and, consequently, the cadmium content.

Figure 2:
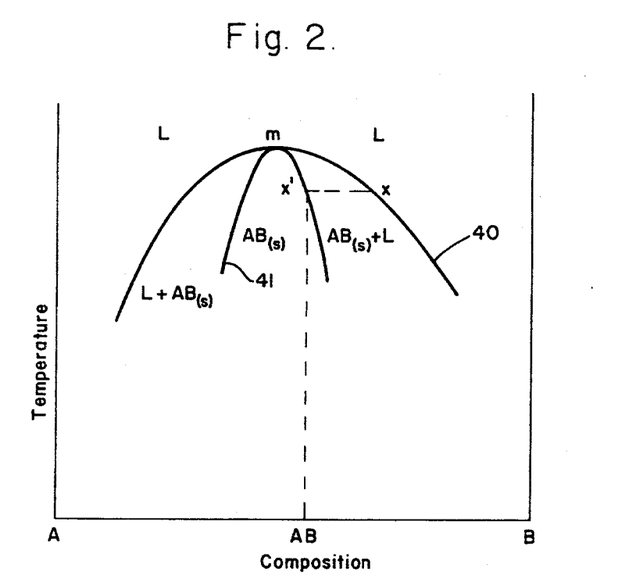
FIG. 2 schematically depicts the temperature-composition phase curve for a two-constituent compound.

Specifically, with reference to FIG. 2, wherein L is the liquidus phase and S is is the solidus phase of a two-component system comprising components A and B, for each point x on the liquidus-solidus interface represented by curve 40, there is a corresponding pressure of the volatile component A or B. If a certain vapor pressure of the component is maintained over the melt, the system has a tendency to remain at the composition corresponding to the vapor pressure applied. As solidification takes place, the segregation process tends to make the melt more and more concentrated with regard to the component present in excess; however, the liquid then is no longer in equilibrium with the vapor, and a reaction between the vapor melt occurs until equilibrium is again reached. The end results of these interactions depend on the rate at which the composition changes as a consequence of the segregation, compared to the rate with which atoms are transferred between the melt and the vapor. Eventually, a stationary state is reached in which the crystals attain a composition somewhere between x' and m in the existence region contained within curve 41, that is, in the region in which a range of compositions can exist for which the solid compound is stable, see for example M. Aven and J. S. Prener, ed., *Physics and Chemistry of II–VI Compounds* (New York: John Wiley & Sons, Inc.) pp. 169–171 (1967) and W. Albers and C. Haas, *Philips Technical Review*, Vol. 30, pp. 82–87, 107–112 and 142–147 (1969).

Because the composition of cadmium telluride is a function of the chemical potential of one of the components when grown from the melt, it is desirable to grow crystals of cadmium telluride under conditions where the chemical potential of one of the components is controlled. This is accomplished with the modified Bridgman system or technique utilized in conjunction with elongated tube 16 so that cadmium or tellurium can be placed high in the tube in receptacle 30 where its vapor pressure is controlled by furnace 10 operating significantly below the temperature of crystal furnace 12. Thus, the properties of the compound are determined by the pressure of one of the components above the melt.

The modified Bridgman system noted above controls the composition of the melt and, consequently, the solid by controlling the pressure of one of the components of cadmium telluride over the melt, stops decomposition and/or sublimation of the melt, and controls the distribution coefficients of the dopants.

The theory of equilibrium between solid-liquid-gas discussed herein for this system indicates that the liquid acts only as a transferring medium between gas and solid phases and, consequently, the system may be treated as a gas-solid system with respect to defect chemistry. In explanation of this theory, it is helpful to assume a model for the liquid which is equivalent to the normal crystalline model of the solid expressible as either of two types, a "gas-like" model and "crystal-like" model. In the gas-like model, the perfect liquid is assumed to consist of molecules and dissociation products of the molecules. Ionization may occur which leads to additional imperfections. In the crystal-like model, the liquid is regarded as a crystal with an exceptionally large concentration of the Schottky-Wagner or Frenkel type defects. Intrinsic excitation and ionization are assumed to take place exactly as in a solid. Statistically both models are equivalent and give the same results.

Consequently, in the following explanation using cadmium telluride as an example where cadmium is the A component and tellurium is the B component, where x indicates an uncharged atom, $\alpha$ is the defect in liquid caused by the addition of $Cd^x$; in the liquid, $\beta$ is the defect in liquid caused by removal of $Cd^x$ from the liquid; g, l, and s are the gaseous, liquid, and solid phases, respectively, of the cadmium telluride components; P is pressure, and K is the equilibrium constant. Accordingly, $Cd_g \rightleftharpoons Cd_l + \alpha$, and for small concentrations of $\alpha$, $$K_1 = \frac{[\alpha]}{P_{Cd}} \qquad (1)$$

Also, $Cd_l \rightleftharpoons Cd_g + \beta$, and for small concentrations of $\beta$, $$K_2 = [\beta][P_{Cd}] \qquad (2)$$

Under these conditions, $$K_{CdTe} = P_{Cd} P_{Te}^{\frac{1}{2}} \qquad (3)$$

since $CdTe \rightleftharpoons Cd_{(g)} + \frac{1}{2} Te_{2(g)}$. Accordingly, $$[\alpha][\beta] = K_{\alpha\beta} \qquad (4)$$

or the composition of the liquid is a function of $P_{Cd}$.

In the equilibrium between liquid and solid, the transfer of atoms from one phase to the other as well as imperfections within each phase are describable as reactions. Transfer of electrons or ions need not be considered since both phases remain neutral. If such particles are transferred, electrons and ions are transferred in equal concentrations, so that the final reactions may be expressed in terms of the transfer of neutral atoms and vacancies. Consequently, let a be a defect caused by removal of a cadmium atom from the solid. Then, $$Cd_s{}^x + \beta \rightleftarrows Cd_l{}^x + b \text{ where}$$

$Cd_s{}^x$ and $Cd_l{}^x$ are un-ionized atoms in solid and liquid, respectively. For small concentrations of $\beta$ and b, $$K_3 = \frac{b}{\beta} \quad (5)$$

Also, $Te_s{}^x + a \rightleftarrows Te_l{}^x + a$, $$K_4 = \frac{a}{\alpha}, \quad (6)$$

and $$[a][b] = K_{ab} \quad (7)$$

With the aid of equations (4), (5), (6), and (7), $$[a][b] = K_3 K_4 K_{\alpha\beta} = K_{ab}.$$

The foregoing theory was simplified by assuming that (1) the liquid is always homogeneous, (2) diffusion in the solid is slow and, therefore, the composition of the solid does not change after having grown from the liquid, (3) the gas phase equilibrium $CdTe_{(g)} \rightleftarrows Cd_{(g)} + \frac{1}{2}Te_{2(g)}$ is reached quickly with cadmium telluride molecules not present in any significant amounts, (4) the distribution coefficients are constants which are independent of composition, and (5) the solid-liquid distribution is adjusted quickly. In the modified Bridgman system described herein, the gas and solid phases are physically separated from each other by the liquid phase so that essentially the liquid phase acts as a communication medium since the composition of the liquid phase is determined by the pressure of one of the components of cadmium telluride.

The quantity of constituent 28 needed in reservoir 30 is not critical since the pressure is determined by the temperature of the reservoir and is independent of the amount of material in the reservoir. Of course, if insufficient material were placed in the reservoir, then obviously the required pressure could not be obtained. The exact amount can be determined from a pressure-temperature-composition phase diagram; however, in actual practice, simply more constituent is used than is required.

Figure 3:
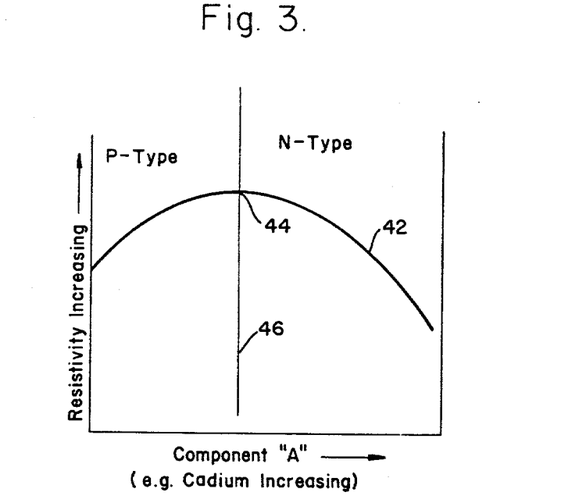
FIG. 3 is a graph, not to scale, of the resistivity versus temperature-pressure curve for obtaining carrier concentration and resistivity of the crystals of the present invention.

As an aid to understanding the method by which a particular electrical characteristic, in terms of resistivity, and the carrier type of the crystal is obtained, reference is made to FIG. 3. Curve 42 represents the resistivity curve for cadmium telluride which is representative of some II–VI, III–V, or IV–VI Group compound crystals having either a P-type or an N-type nature. A maximum resistivity occurs at point 44 of curve 42. To the left of a line 46 passing through point 44, the crystal is P-type while to the right of line 46, the crystal is N-type. As the crystal becomes more P-type or N-type, the resistivity decreases. Each point of resistivity corresponding to the degree of P-type or N-type concentration is determined by the pressure of the crystal constituent. Thus, as the melt composition moves toward the right hand side, that is, toward the "N-type" area, so also does the solid composition move and the electrical properties will accordingly vary. Furthermore, to obtain the particular electrical characteristic, the compound composition must remain a constant. By using a reservoir supply, the melt composition can be kept constant, thus insuring a constant solid composition. For cadmium telluride and the cadmium constituent, as the temperature 18 of furnace 10 (FIGS. 1 and 1a) increases, the cadmium pressure also increases, thereby increasing the conductivity. The same analysis is true when the cadmium pressure is allowed to decrease toward the left of FIG. 3 in order to obtain a "P-type" semiconductor material. The further to the left the composition moves in accordance with decreased cadmium pressure, the lower the resistivity becomes. Therefore, the temperature and pressure of the cadmium constituent are so controlled as to obtain a point just to the left or right of the highest resistivity characteristic at point 44.

Therefore, the pressure of the compound constituent is closely controlled so as to obtain the desired resistivity. Initially, the tube and its contained materials are maintained stationary within furnaces 10 and 12 for a period of time sufficient to obtain stabilization of composition under the adjusted temperature-pressure parameters of the system. In particular, the pressure-temperature conditions which impart the high resistivity characteristics to the material of the present invention is indicated in the phase diagram depicted in FIG. 4.

Figure 4:
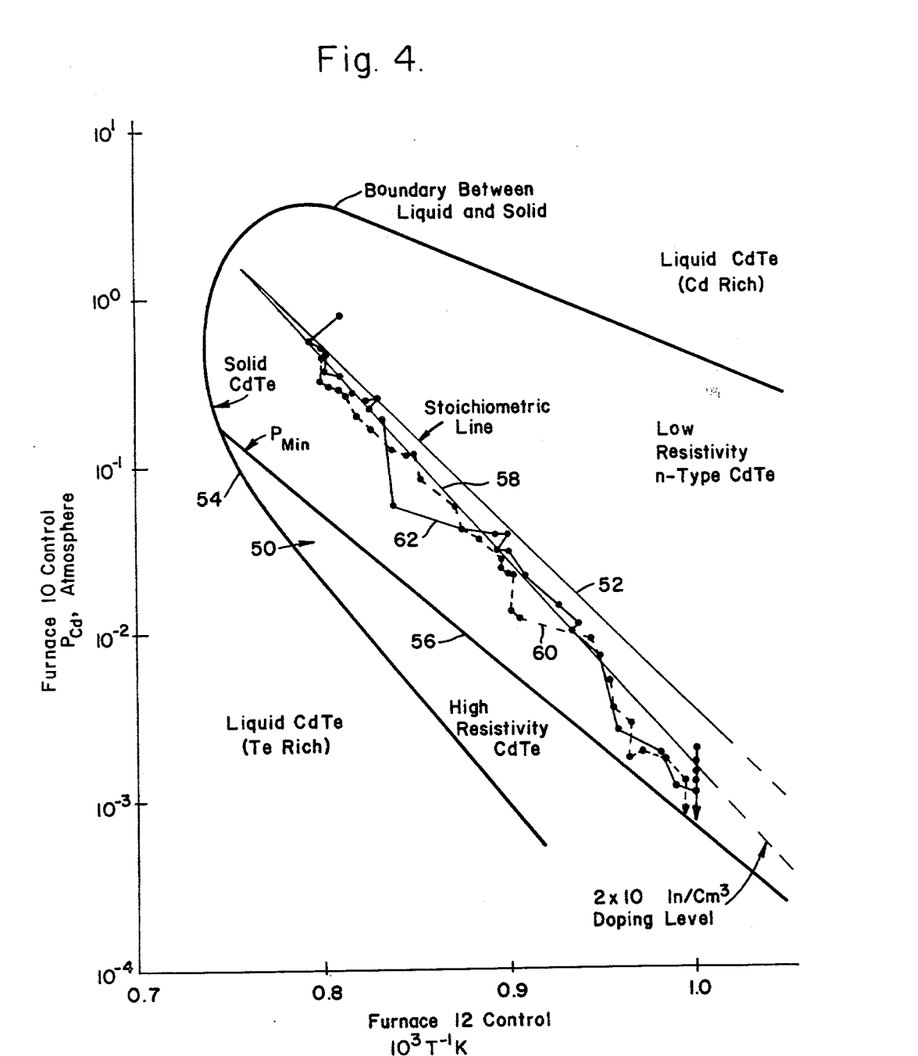
FIG. 4 schematically depicts the pressure-temperature phase diagram for cadmium telluride.

For tellurium, a similar phase diagram exists which is obtainable by converting cadmium pressure to tellurium pressure in accordance with mass action law. Any tellurium pressure above the minimum pressure for sublimation will result in a high resistivity crystal.

For a camdium telluride crystal doped with a donor, high resistivity occurs therein under such pressure-temperature conditions as occur within the high resistivity zone identified by indicium 50, lying between dope line 58 and line 54, the boundary between tellurium rich liquid cadmium telluride and solid cadmium telluride. Consequently, for any pressure of cadmium and temperature of cadmium telluride which falls within high resistivity zone 50, high resistivity cadmium telluride will be produced.

When growing cadmium telluride with a cadmium overpressure, for example, it is preferred to use a partial cadmium pressure of 0.8 to 1.2 atmospheres since this pressure provides the best material crystallinity however, it is to be understood that acceptable crystals can be grown at other cadmium (or tellurium) pressures.

Once the material is brought to the proper pressure and temperature favoring the growth of high resistivity material, the pressure-temperature relationship is stabilized for a time sufficient to bring the composition to equilibrium.

Tube 16 is then lowered to pass section 24 through decreasing temperature gradient 22 at a rate commensurate with crystal growth until melt 26 has been fully solidified into a single crystal.

Thereafter, the crystal is heat-treated either in the crystal growth tube and furnace or in a separate heat-treatment tube and furnace. In either case, the temperature of the crystal and component in the reservoir are lowered in a controlled manner. Specifically, cooling is controlled in such a manner that the crystal composition corresponding to the high resistivity area 50 of the phase diagram shown in FIG. 4 is maintained. This controlled cooling is accomplished by adjusting the temperature of the crystal and the temperature (and thereby pressure) of the component reservoir to maintain those conditions. It is important that cooling be maintained between stoichiometric line 52 and $P_{min}$ line 56 where $P_{min}$ defines the line where the total pressure over cadmium telluride, for example, has a minimum value, see for example F. A. Kroger, *The Chemistry of Imperfect Crystals* (New York: John Wiley & Sons, Inc.) pp. 85 and 87–90 (1964) and D. de Nobel, *Philips Research Reports*, Vol. 14, pp. 373–376 (1959). At any point on the $P_{min}$ line, the crystal exhibits congruent sublimation, that is, where the gas phase has the same composition as the solid phase and the sublimation rate is a maximum. If movement were across the dope lines 58, then the dopant influences the resistivity by decreasing the resistivity. However, short time movements across the dope line or the stoichiometric line do not change process results if movement returns to the high resistivity area for the reason that random walk diffusion coefficients are slow and chemical diffusion coefficients are fast. Thus, movement back across these lines into the high resistivity area results in crystal properties as if these lines had never been crossed.

Experimental evidence proved out the requirements for the slow-cool method. Initial experiments followed conditions in the range of high $\rho$ (resistivity) as indicated by indicium 50 of FIG. 4. Disks so treated were evaluated; resistivity was high and the optical density was typically of the order of 0.003 to 0.008 cm$^{-1}$. Further experiments were carried out using neighboring areas of the phase diagram being careful to avoid the $P_{min}$ region where compositional sublimation occurs typically resulting in deep thermal etching of the samples. However, results were not reproducible and although free carrier absorption appeared to have been eliminated, absorption coefficients were not always low. The pursuit of this method appeared important because the rate of cooling is essentially independent of the size of the sample. The anneal was carried out as low as 700° C., but the final cooling (quench) rate of the disk below this temperature was not found too significant because of the slow diffusion rates involved in that temperature region. This process also reduces any thermal strain that may have existed in the material as-grown.

Additional experiments led to the observation that a time factor was involved in the initial soaking; some crystals had low absorption coefficients whereas some did not, even though they had been heat treated simultaneously by the slow-cool method. This anomaly had also been observed at about the same time in the high temperature quench method, as reported in the above-mentioned Journal of the Electrochemical Society.

Figure 5:
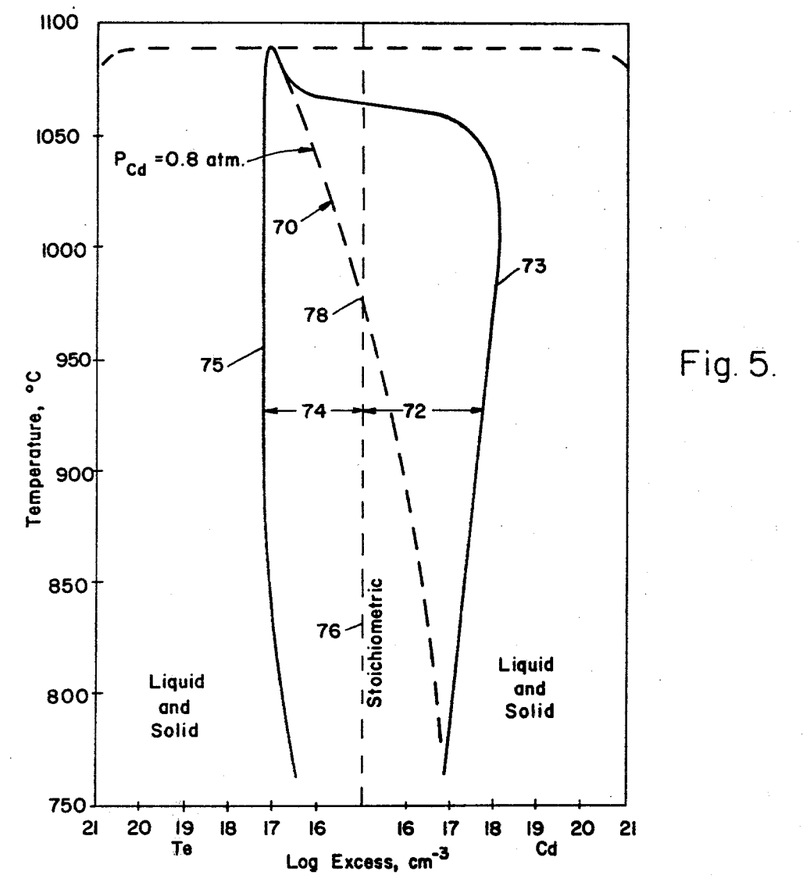
FIG. 5 is a phase diagram of cadmium telluride, similar but more specific to FIG. 2, showing retrograde solidus.

A relationship was surmised between the way ingots were grown, particularly cooling procedures, and consequently the composition, not neglecting impurities, which gave these inconsistencies in the heat treatment results. For example, as shown in FIG. 5, if an ingot is slow cooled along the isobar 70 for $P_{Cd}=0.8$ atm. almost to room temperature from the growth furnace, it will have a higher concentration of cadmium, as shown by the area designated by indicium 72 between stoichiometric line 76 and solidus line 73 than one taken out of the furnace at a higher temperature such as shown by the area designated by indicium 74 between stoichiometric line 76 and solidus line 75. Ideally, crystals are removed close to the stoichiometric line 76 but on the Te-rich side such as at point 78. Crystals are grown and cooled nearly to room temperature in order to obtain a maximum amount of material; crystals removed at about 980° C. have a different composition than those cooled to ambient conditions. Cooling at the end of the growth process apparently was responsible for the inconsistencies. Heat treating the crystals at a high temperature in the high resistivity range for a longer time established composition equilibrium prior to commencement of the slow cool-down stage of the equilibration process. In addition, in order to maintain the excess tellurium concentration but at a minimal, anneal was maintained in or near the high resistivity side of the high $\rho$-low $\rho$ boundary line corresponding to the dopant concentration of $2\times 10^{17}$ In/cm$^3$. The final temperature-pressure point must lie in the high resistivity area.

FIG. 4 shows two slow-cooled paths 60 and 62 followed for two separate heat treatments. The times of heat treatment, including time to cool, were approximately 8 days. The results of optical absorption measurements of disks so treated in these two runs are shown in Table I.

TABLE I

Results of Slow-Cool Thermal Anneal on CdTe Disks

| Sample No. | Starting Material | Absorption Coefficient, $\beta$, cm$^{-1}$ |
|---|---|---|
| 247-1 | Cominco (69)[a] | 0.0018 |
| 247-5 | Cominco (69) | 0.006 |
| 253-4 | Cominco (DZR)[b] | 0.0013 |
| 254-1 | Kawecki(595)[c] | 0.004 |
| 254-2 | Kawecki (595) | 0.0019 |
| 254-3 | Kawecki (595) | 0.0018 |
| 254-6 | Kawecki (595) | 0.0024 |
| 255-1 | Cominco (SPDZR)[d] | 0.00096 |
| 255-2 | Cominco (SPDZR) | 0.0012 |
| 255-3 | Cominco (SPDZR) | 0.00089 |

[a] 99.9999% pure
[b] Double zone refined, minimum 99.9999% pure
[c] 99.9995% pure
[d] Specially processed double zone refined Cd and Te as in (b) above Crystals that had previous heat treatment by the quench technique without success were observed to respond to this method favorably. The results, as shown in Table I, however, show an improvement in transmission with the achievement of a low absorption coefficient of 0.0007 cm$^{-1}$ being realized. In addition, the majority of the disks so treated had $\beta<0.002$ cm$^{-1}$.

Experimental evidence suggests the following theoretical considerations as to mechanisms of heat-treatment.

Although the mechanism of absorption of 10.6 $\mu$m in CdTe has not been definitely identified, it is widely suspected that precipitates play an important role. Since values of absorption coefficient as low as 0.0007 cm$^{-1}$ have been measured, higher values than this may be associated with the presence of growth-dependent features, such as precipitates, in the material. Even the lowest reported values may arise from a residual precipitate density. Theoretical analysis of multiphonon absorption processes associated with lattice anharmonicity indicates that these processes account for only a small portion of the 10.6 $\mu$m absorption observed in CdTe. CdTe should have a very low absorption coefficient if the same lattice absorption processes are dominant at 10.6 $\mu$m as in ZnSe and GaAs.

It has been estimated that the intrinsic absorption coefficient of CdTe to be of the order of $10^{-8}$ cm$^{-1}$. The remainder of the observed absorption may be removable by improved preparation and processing techniques.

If the hypothesis is adopted that precipitates determine the absorption at 10.6 μm in CdTe, one must consider how the conditions of preparation and heat treatment can influence the nature and density of a precipitated phase. The boundary between high-and-low-resistivity regions in indium-doped CdTe corresponds to a composition on the CdTe-In$_2$Te$_3$ pseudobinary. Because CdTe and In$_2$Te$_3$ have similar crystal structures and are miscible up to large concentrations of In$_2$Te$_3$, the composition would be expected to be free of precipitates. The high/low boundary is determined by the electroneutrality condition, $$[In^+] + p = 2[V''_{Cd}] + [V'_{Cd}] + n, \quad [1]$$

and the condition that there are just enough electrons present at high temperature to recombine with the holes and fill up all the $V'_{Cd}$ centers:

$$n = [V'_{Cd}] + p. \quad [2]$$

Figure 6:
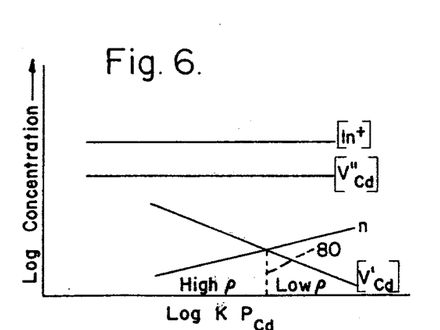
FIG. 6 illustrates concentration of imperfections for indium doped cadmium telluride.
Figure 7A:
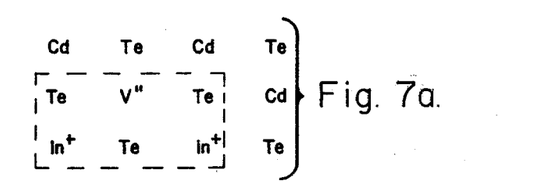
FIGS. 7a and 7b depict dimensional representations of defects in indium doped cadmium telluride.

This is the condition on dotted line 80 in FIG. 6. For smaller values of n, some $V'_{Cd}$ remains at room temperature to serve as an electron trap and pin the Fermi level near the middle of the gap. When equations [1] and [2] are satisfied, $$[In^+] = 2]V''_{Cd}] + 2[V'_{Cd}] = 2[V_{Cd}{}^{total}], \quad [3]$$

since the concentration of neutral cadmium vacancies is negligible. At room temperature under these conditions, all the $V'_{Cd}$ will have trapped electrons to form $V''_{Cd}$ and it may be expected that the formation of entities such as depicted in FIG. 7a with two In atoms for each Cd vacancy, corresponding to the CdTe-In$_2$Te$_3$ pseudobinary. The miscibility along the pseudobinary is an indication that there is no tendency for further clustering or segregation.

Figure 7B:
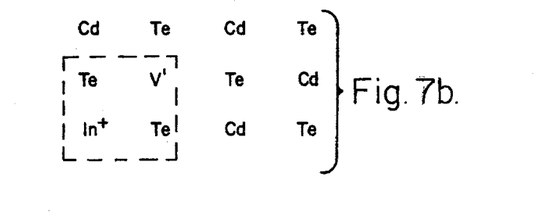

When the high-temperature conditions correspond to lower n than required by equation [2], the composition will be on the Te-rich side of the pseudobinary. In accounting for cooling rate effects on resistivity, the formation of clusters or separate phases involving In$^+$ and $V'_{Cd}$ may be shown as depicted in FIG. 7b. Since this interpretation requires the elimination of electron traps, and because an isolated In$^+$+$V'_{Cd}$ complex is an even better electron trap than $V'_{Cd}$ alone, it is assumed further clustering of the isolated complexes to form a separate phase, which is suggested to be InTe$_2$. Although InTe$_2$ is not a known stable phase, and principitated phases in In-doped CdTe have not yet been identified, it is suggested that compositions on the Te-rich side of the pseudobinary will produce precipitates of some kind because of the generally retrograde solubility behavior of native defects.

This theory suggests the possibility of reducing precipitates by working with a P$_{Cd}$ in the thermal annealing process as close as possible to the boundary between high and low resistivity, changing P$_{Cd}$ as a function of temperature to stay at the boundary at all temperatures high enough to allow atomic rearrangements in the crystal. Experimental results correspond with the concept.

In the above description of the present invention, the preferred method of growing the desired high resistivity, low absorption coefficient material is described as that method set forth in the copending patent application which eventuated into above-mentioned U.S. Pat. No. 3,870,473. It is to be understood, however, that any suitable growth method is as applicable, such as the zone refining method described by de Nobel in his above-noted Phillips Research Reports, Vol. 14, pages 361-492 (1959), or by Lorenz and Halsted in the Journal of the Electrochemical Society, Vol. 110, No. 4, pp 343-344, so long as the resulting crystal has the desired compositional qualities which will provide high resistivity, low absorption coefficient material.

Furthermore, the time sequence after growth of the crystal and beginning anneal of the crystal is unimportant. In particular, the crystal may be slow cooled in furnaces 10 and 12 directly after growth and removed from these furnaces and crystal growth tube 16 and positioned in another tube and two-temperature furnace. The latter is preferable solely from an economic point of view. The crystal growth furnaces depicted in FIG. 1 comprise a Marshall multi-tapped platinum-Kanthal-wound furnace, suitably coupled to a pair of power supply and digital temperature control units for each furnace. Such furnaces are quite expensive and degrade when their temperatures are raised and lowered. Thus, it is preferable and economic to maintain these furnaces hot. In so maintaining them at elevated temperatures, they became no longer available for the inventive slow-cool method. Accordingly, after crystal growth is completed, tube 16 is lowered through the furnaces by means of rod 38 at a rate appropriate to nucleation of the particular compound, e.g., approximately 0.20 inches per hour for cadmium telluride, so that nucleation tips 36 passes through the decreasing temperature gradient 22 in order to solidify the melt into a single crystal as it passes through the liquid-solid plane of the decreasing temperature gradient. The length of furnace 10 and its uniform temperature curve 18 is maintained long enough so that the temperature and, therefore, the pressure of constituent 28 will not vary and thereby will not affect the constituent vapor pressure.

Figure 8:
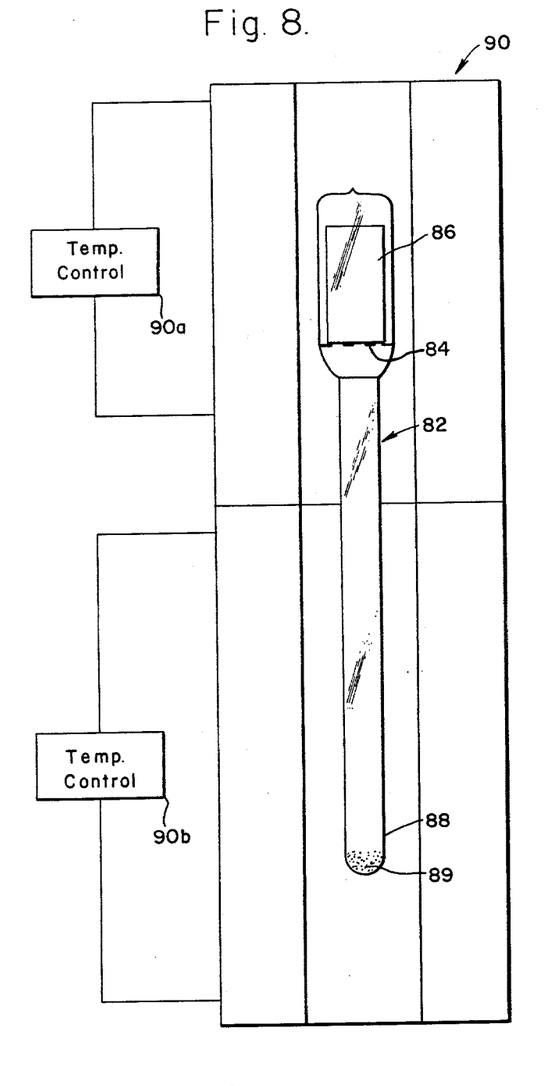
FIGS. 8 and 8a respectively illustrate an alternate two-part furnace and its temperature curve for slow-cooling a crystal.
Figure 8A:
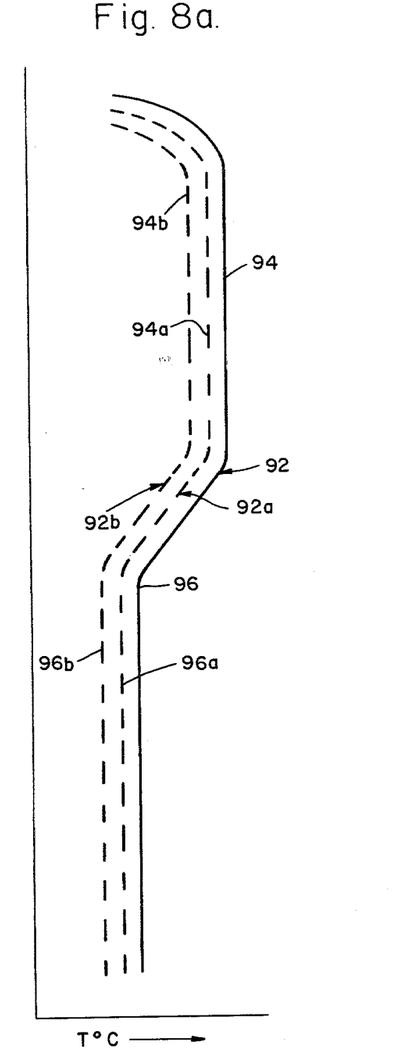

If cost considerations are unimportant, however, furnaces 10 and 12 may be used for the slow-cool anneal in one of two manners. First, the temperature profiles 18 and 20 are adjusted by controls 10a and 10b to provide a cooling path, as depicted in FIG. 8a, for the crystal to reside within high resistivity region 50 of the phase diagram depicted in FIG. 4 between stoichiometric line 52 and P$_{min}$ line 56. Tube 16 is then lowered through the furnaces, with any further temperature regulation as may be required. Alternatively, the tube is maintained stationary and temperature controls 10a and 10b are continuously adjusted to provide the proper pressure-temperature relationships necessary to provide the desired slow-cool anneal. This former method is unwieldy and, for this reason, further undesired.

The preferred method for the slow-cool anneal, as indicated above, is to grow the crystal within furnaces 10 and 12 and then to remove the grown crystal from tube 16. The crystal from these furnaces, or obtained from any other suitable method, is then placed in a new tube, although it is possible to leave the crystal in tube 16 and utilize the crystal growth tube for annealing purposes. Such a new tube 82 is depicted in FIG. 8 and includes a perforated platform 84 on which the crystal 86 is placed and a bottom portion 88 in which one of the crystal components 89 is positioned. Platform 84 is perforated with any suitable openings to enable the gaseous component to reach the crystal. The tube is then evacuated to about $10^{-8}$ Torr or backfilled with an inert gas, as before, and sealed. The tube and its contents is then placed within a two temperature zone furnace 90 having controls 90a and 90b for providing a furnace temperature curve and the desired pressure-temperature relationships required to slow-cool the crystal along such a path as paths 60 and 62 of the phase diagram shown in FIG. 4. This furnace temperature curve is identified by curve 92 having a higher temperature portion 94 for compound crystal 86 and a lower temperature portion 96 for component 89. The controlled lowering of furnace temperatures by controls 90a and 90b are illustrated by dashed curves 92a and 92b with their respective portions 94a, 94b and 96a, 96b. The crystal constituent pressure is adjusted during the slow-cool according to the temperature of the material to maintain it on its required high resistivity path.

Other compounds amenable to the method of the present invention include, but without limitation, the tellurides, sulfides and selenides of zinc, cadmium, mercury, tin, and lead and the arsenides, phosphides and antimonides of gallium, aluminum and indium. Suitable dopants include any donor or acceptor which is compatible with the particular compound.

Although the invention has been described with reference to particular embodiments thereof, it should be realized that various changes and modifications may be made therein without departing from the spirit and scope of the invention.

What is claimed is:

1. A method for growing and heat-treating a II-VI group semiconductor compound having a predictable specific carrier concentration comprising the steps of:
   placing a charge of a substantially stoichiometric quantity of the II-VI Group compound in a first section of a crystal growing vessel;
   placing one of the elements of the II-VI Group compound in a second section of the crystal growing vessel;
   sealing the vessel;
   melting the contained II-VI Group compound charge for providing a melt therefrom;
   vaporizing the element in the second vessel section for obtaining a vapor therefrom;
   providing a specific vapor pressure of the element vapor over the melt commensurate with the specific carrier concentration for enabling the semiconductor compound to be imparted with the predictable specific carrier concentration;
   solidifying the melt to a crystal;
   providing an environment for the solidified crystal at a pressure and temperature of the crystal and under a vapor pressure of one of the constituents of the crystal only within that pressure-temperature region corresponding to that area of the pressure-temperature phase diagram of the II-VI Group compound bounded by the minimum pressure of the compound and its stoichiometric line; and
   lowering the temperatures and pressures of both the crystal and the one constituent by at least two separate controller apparatus which individually but coordinatedly decrease both of the temperatures of the crystal and the one constituent for cooling the solidified crystal under decreasing temperature and pressure applied thereto in the environment and for imparting the predictable specific carrier concentration to the crystal, said individual but coordinated temperature and pressure lowering step commencing after growth of the crystal and occurring at a cooling rate sufficiently slow and only within the corresponding pressure-temperature region for maintaining the crystal properties corresponding to the area.

2. A method as in claim 1 further including the precooling and post solidifying step of:
   reheating the solidified crystal in an atmosphere of the element.

3. A method as in claim 1 wherein the II-VI Group compound charge consists of cadmium telluride.

4. A method as in claim 3 wherein said one of the II-VI compounds is from the group consisting of cadmium and tellurium and the vapor pressure thereof exceeds the minimum pressure of cadmium telluride.

5. A method as in claim 3 wherein said crystal growing step includes the step of adding indium to the cadmium telluride charge for obtaining active donor impurities therein.

6. A method for obtaining a semiconductor crystal compound selected from one of the II-VI, III-V, and IV-VI Groups of the Periodic Table of Elements having a predictable specific conductivity type and carrier concentration comprising the steps of:
   placing a charge of a substantially stoichiometric, chemically pure quantity of a compound selected from one of the Groups and one of the selected Group constituents in separate parts of a crystal growth tube and evacuating and sealing the tube, and selecting the selected Group constituent for being capable of producing an equilibrium pressure of the selected Group compound;
   melting the charge for providing a melt therefrom;
   vaporizing the selected Group constituent for providing a vapor therefrom such that the partial pressure of the constituent vapor establishes the composition of the melt, thereby for determining the specific conductivity type and the carrier concentration of the crystal compound;
   moving only that part of the tube containing the melt through a decreasing temperature gradient under pressure-temperature conditions corresponding to the existence region of the pressure-temperature phase diagram of the selected group compound at a rate commensurate with growth of the crystal compound for forming a crystal compound having the predictable specific conductivity type and the carrier concentration; and
   simultaneously decreasing the temperatures of the crystal compound and the constituent by separate temperature controlling apparatus respectively coupled thereto for subjecting the crystal compound to the constituent vapor and to pressure-temperature conditions corresponding to the existence region of the pressure-temperature phase diagram of the selected group compound for maintaining the specific conductivity type and the predictable carrier concentration of the compound.

7. A method for growing and heat-treating cadmium telluride to obtain sufficiently high resistivity material suitable for use as in semiconductor devices, high temperature gamma ray counters, gamma spectrometers, optical modulators, infrared windows and infrared light pipes from a charge of elemental components of cadmium telluride or of compound cadmium telluride comprising the steps of:

placing a chemically pure quantity of the charge plus an N-type dopant equivalent to $10^{16}$ to $10^{18}$ atoms per cubic centimeter of the charge in a first section of a crystal growing tube;

placing one of the elements cadmium or tellurium in a second section of the crystal growing tube;

evacuating and sealing the tube;

heating the first tube section and the contained charge and dopant to a first temperature above the melting point thereof for providing a melt of doped cadmium telluride;

heating the second tube section and the one element to a second temperature sufficient for providing a vapor therefrom, and setting the second temperature at a temperature less than the first temperature;

establishing the first and second temperatures respectively of the melt and the element for providing a partial pressure of the one element vapor over the melt for thereby obtaining a desired concentration of cadmium or tellurium in the melt, and setting the temperature-pressure parameters outside the existence region of cadmium telluride;

growing a solid crystal from the cadmium telluride melt by lowering the temperature of the melt below its melting point for initiating the solid crystal in the existence region while maintaining the second temperature of the element constant; and heat-treating the crystal by cooling independently the solid crystal and the element by means of at least two controlling apparatus at a controlled coordinated manner such that the pressure and temperature of both the crystal and the element decrease within the existence region of cadmium telluride corresponding to that area of the pressure-temperature phase diagram of cadmium telluride bounded by the minimum pressure line of the cadmium telluride compound and that doping level line established by the N-type dopant for imparting the high resistivity to the crystal, said cooling step occurring at a sufficiently slow rate and terminating at a sufficiently low temperature for maintaining and stabilizing at least the high resistivity of the crystal.

8. A method as in claim 7 wherein the dopant is indium.

9. A method as in claim 7 wherein the vapor pressure of the one element above the cadmium telluride exceeds the minimum pressure of sublimation of the cadmium telluride.

10. A method as in claim 7 further including the steps of utilizing first and second furnaces for providing two temperature zones and conducting said cooling step within one of the two temperature zones in the first of said furnaces and conducting said remaining steps within the other of the two temperature zones in the second of said furnaces.

11. A method for obtaining a crystal of cadmium telluride from a charge of elemental components of cadmium telluride or of compound cadmium telluride, having reproducibly consistent values of high resistivity between $10^5$ to $10^9$ ohm-centimeters and a low optical absorption coefficient of less than 0.002 cm$^{-1}$ in a crystal growing furnace having a temperature profile, the profile having a decreasing temperature gradient and the gradient including a cadmium telluride liquid-solid interface, comprising the steps of:

placing a quantity of the charge plus an N-type dopant equivalent to approximately $10^{16}$ to $10^{18}$ atoms per cubic centimeter in a first part of a sealed crystal growth tube, and a quantity of one of the elements cadmium and tellurium in a second part of the crystal growth tube which is separated from the first part and sealing the tube;

melting the charge and donor at a first temperature for providing a melt therefrom;

vaporizing the one element at a second temperature lower than the first temperature for providing a vapor therefrom such that the partial pressure of the element vapor controls the cadmium and tellurium concentration of the melt, and setting the partial pressure and the second temperature outside the existence region of cadmium telluride;

moving the tube and the melt through the decreasing temperature gradient and sufficiently past the liquid-solid interface at a rate commensurate with crystal growth for solidifying the melt into a crystal while maintaining the one element temperature constant at the second temperature; and heat-treating the crystal at a pressure and temperature within the pressure-temperature region corresponding to the area of the high resistivity and low absorption coefficient of the pressure-temperature phase diagram of cadmium telluride as depicted in FIG. 4 substantially bounded by the minimum pressure line of cadmium telluride and the level of the N-type donor by coupling separate temperature controllers respectively to the crystal and the element which coordinately decrease both the crystal temperature and the one element temperature, said cooling step occurring at a rate sufficiently slow and terminating at a sufficiently low temperature for maintaining and fixing the high resistivity and low absorption coefficient crystal properties corresponding to the area of the pressure-temperature phase diagram of cadmium telluride.

12. A method as in claim 11 wherein said cooling step is conducted in means for defining an annealing furnace for providing a plurality of temperature profiles each comprising a pair of isothermal temperature portions for defining two different temperatures below the melting point of cadmium telluride connected by a temperature gradient.

13. A method as in claim 12 further comprising the steps of removing said solidified crystal from the crystal growth tube and placing said solidified crystal in means for defining a crystal annealing tube for annealing of said solidified crystal in the annealing furnace means.

14. A method as in claim 13 wherein said crystal annealing tube is provided with means for supporting the solidified crystal and with means for holding a quantity of the one element.

15. A method for growing and heat-treating cadmium telluride having reproducibly consistent resistivity values of $10^5$ to $10^9$ ohm-centimeters comprising the steps of:

placing a charge of a substantially stoichiometric, chemically pure quantity of camium telluride in a first section of a crystal growing tube;

placing at least cadmium in a second section of the crystal growing tube;

evacuating the tube for substantially removing any contaminants therefrom which otherwise preclude growth of the cadmium telluride having the reproducibly consistent resistivity values of $10^5$ to $10^9$ ohm-centimeters and sealing the tube;

heating the first tube section and the contained cadmium telluride to a first temperature for forming a melt therefrom;

heating the second tube section and the cadmium to a second temperature lower than the first temperature sufficient for producing a cadmium vapor above the melt at a pressure of approximately 0.9 atmospheres;

in said heating steps, establishing the first and second temperatures respectively of the melt and of the cadmium for providing a specific pressure of the cadmium vapor commensurate with and resulting in the reproducibly consistent resistivity values of $10^5$ to $10^9$ ohm-centimeters of the intrinsic cadmium telluride;

cooling the melt at least sufficiently for forming a solid therefrom while maintaining the second temperature constant; and slowly cooling the solid by separate controlling apparatus coupled to the solid and the cadmium for decreasing the temperature-pressure conditions of both the solid and the cadmium for maintaining the resistivity.

16. A method for obtaining cadmium telluride, having a resistivity and absorption coefficient of magnitudes sufficient for use as in semiconductor devices, high temperature gamma ray counters, gamma ray spectrometers, optical modulators, infrared windows, infrared light pipes and the like, from a charge of elemental components of cadmium telluride or of compound cadmium telluride in at least one crystal growing furnace having a temperature profile including a decreasing temperature gradient having a cadmium telluride plane of nucleation comprising the steps of:

placing the charge plus an N-type dopant and one of the elements cadmium or tellurium respectively in separate parts of a crystal growth tube and evacuating and sealing the tube;

melting the charge and dopant for providing a melt therefrom;

vaporizing the one element for providing a vapor therefrom and for establishing a partial pressure of the element vapor over the melt for thereby controlling the cadmium and tellurium concentration of the melt, and for constituting the melt with a composition capable of imparting a crystal to be formed from the melt with the resistivity and the absorption coefficient;

moving the melt through the decreasing temperature gradient and sufficiently past the plane of nucleation at a rate commensurate with crystal growth for solidifying the melt into a crystal and for imparting the crystal with the resistivity and absorption coefficient while maintaining constant the one element temperature; and utilizing separate controlling apparatus respectively coupled to the separate parts of the crystal growth tube for cooling both the crystal and the element under controlled decrease of temperature of both the crystal and the element and thereby for maintaining the resistivity and the absorption coefficient.

17. A method for obtaining cadmium telluride, having a resistivity and absorption coefficient of magnitudes sufficient for use as in semiconductor devices, high temperature gamma ray counters, gamma spectrometers, optical modulators, infrared widows, infrared light pipes and the like, from a charge material of cadmium telluride or elemental cadmium and tellurium and an N-type donor sufficient for obtaining active donor impurity in the approximate range of $10^{15}$ to $10^{18}$ $cm^{-3}$ and under a partial pressure of one of the elements cadmium and tellurium, in a two-part furnace respectively having separately operated first and second control means for providing a two-part temperature profile; one part of the profile having an isothermal portion at a first temperature, and the second part of the profile having an isothermal portion at a second temperature higher than the first temperature and a decreasing temperature gradient terminating the second temperature isothermal portion; the decreasing temperature gradient including a temperature plane corresponding to the solid-liquid interface temperature of cadmium telluride, comprising the steps of:

controlling the cooling of a crystal of cadmium telluride, grown from the charge material and having been moved past the solid-liquid interface temperature plane in the two-part furnace means by the second of the furnace control means, and controlling the partial pressure of one of the elements cadmium and tellurium by the first of the furnace control means, at a crystal cooling rate sufficiently slow and under controlled simultaneously lowering of both portions of the two-part temperature profile and terminating the crystal cooling at a sufficiently low temperature for maintaining the resistivity.

18. A method for heat-treating cadmium telluride, having a resistivity and absorption coefficient of magnitudes sufficient for use as in semiconductor devices, high temperature gamma ray counters, gamma spectrometers, optical modulators, infrared windows, and the like, from a source of cadmium telluride and an N-type donor, comprising the steps of:

cooling the source of cadmium telluride at a rate sufficiently slow by a first controller, and concurrently controlling the pressure of one of the cadmium telluride constituents over the source by a separate second controller under temperature and pressure conditions sufficient for maintaining the cooling of the cadmium telluride within the area of its phase diagram conforming to the resistivity and the absorption coefficient.

19. A method for synthesizing and heat-treating a single crystal of cadmium telluride, having a resistivity and absorption coefficient of magnitudes sufficient for use as in semiconductor devices, high temperature gamma ray counters, gamma spectrometers, optical modulators, infrared windows, and the like, from a source of cadmium telluride plus an N-type dopant, comprising the steps of:

growing the source of cadmium telluride and the N-type dopant in a two-part crystal growth tube, having a first portion for containing one element selected from the group consisting of cadmium and tellurium and a second portion for containing a charge material of compound cadmium telluride or the elements cadmium and tellurium, in two-part furnace means having control means for providing a two-part temperature profile; one part of the profile having an isothermal portion at a first temperature, and the second part of the profile having an isothermal portion at a second temperature higher than the first temperature and a decreasing temperature gradient terminating the second temperature isothermal portion; the decreasing temperature gradient including a temperature plane corresponding to the solid-liquid interface temperature of cadmium telluride;

locating the first tube portion in the first temperature isothermal portion for producing a vapor of the one element;

locating the second tube portion in the second temperature isothermal portion for providing a melt from the charge;

maintaining the tube stationary for a period of time sufficient for establishing equilibrium between the atmosphere of the element vapor and the melt and at a pressure and temperature only outside the existence region of the phase diagram of cadmium telluride as shown in FIG. 4;

moving the second tube portion containing the melt through the decreasing temperature gradient and past the temperature plane thereof at a rate commensurate with crystal nucleation sufficient for obtaining a single crystal, while maintaining the first tube portion within the first temperature isothermal portion for maintaining the equilibrium; and cooling the single crystal of cadmium telluride by a first controller coupled to the second tube portion and the one element by a second controller coupled to the first tube portion at a rate sufficiently slow and under decreasing temperature and pressure conditions of both the single crystal and the one element sufficient for maintaining the cooling of the cadmium telluride within the area of its phase diagram conforming to the resistivity and the absorption coefficient.

20. A method for heat-treating a II–VI, III–V and IV–VI compound comprising the steps of:

heating the compound and then cooling the heated compound in a closed system under a vapor pressure of one of the compound constituents at separately applied decreasing temperatures of compound and constituent lying only within the temperature-pressure region corresponding to the area of the pressure-temperature phase diagram of the compound bounded by the minimum pressure of the constituent and the level of stoichiometry for the compound.

21. A method as in claim 20 further comprising the pre-cooling steps of:

placing the compound and the constituent in separated portions of a tube sealed from contaminants;

placing the tube in a two part furnace, having separate heating and temperature control means, one portion of the tube containing the compound residing in one part of the furnace and the other portion of the tube containing the constituent residing in the second part of the furnace; and individually heating the two furnace parts for providing the heated compound and the vapor pressure of the constituent.

22. A method as in claim 21 wherein said cooling step comprises the step of simultaneously lowering the temperatures of the compound and the constituent in a coordinated manner by adjustment of the separate temperature control means for maintaining the compound within the temperature-pressure region.

23. A method as in claim 22 wherein the compound consists of donor doped cadmium telluride.

24. A method as in claim 22 wherein the compound consists of cadmium telluride doped with an N-type donor of $10^{16}$ to $10^{18}$ atoms per cubic centimeter.

25. A method for heat-treating a crystal of cadmium telluride, suitable for use in semiconductor devices, high temperature gamma ray counters, gamma ray spectrometers, optical modulators, infrared windows and infrared light pipes, in a two part furnace having means for adjustably and separately controlling the temperatures in each part of the furnace and for providing a first range of isothermal temperatures in a first of the furnace parts and a second range of isothermal temperatures in a second of the furnace parts, the first range of temperatures being respectively higher than the second range of temperatures, comprising the steps of:

heating one of the crystal constituents in a closed environment within the furnace at the uppermost temperature of the second range for providing a vapor pressure of the one crystal constituent;

heating the crystal in the closed environment and and subjecting the crystal to the constituent vapor pressure within the furnace at the uppermost temperature of the first range but below the melting point of the crystal;

adjusting the uppermost temperatures of both the first and second ranges for bringing the crystal characteristics to within the pressure-temperature region corresponding to the area of the pressure-temperature phase diagram of cadmium telluride bounded by the line of minimum pressure of the constituent and the line of stoichiometry; and cooling the crystal and the constituent by downward coordinated adjustment of the uppermost temperatures separately by each of the furnace means for maintaining the crystal characteristics within the pressure-temperature region.

26. A method for heat treating a II–VI, III–V and IV–VI compound comprising the step of separately applied coordinated decreasing of overpressure of one compound constituent with lowering of compound temperature within the pressure-temperature region corresponding to the area of the pressure-temperature phase diagram of the compound bounded by the line of constituent minimum pressure and the line of compound stoichiometry.

* * * * *